US010186832B2

(12) United States Patent
Tsuji

(10) Patent No.: US 10,186,832 B2
(45) Date of Patent: Jan. 22, 2019

(54) METHOD FOR FABRICATING SURFACE EMITTING LASER

(71) Applicant: SUMITOMO ELECTRIC INDUSTRIES, LTD., Osaka (JP)

(72) Inventor: Yukihiro Tsuji, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/459,839

(22) Filed: Mar. 15, 2017

(65) Prior Publication Data

US 2017/0271841 A1    Sep. 21, 2017

(30) Foreign Application Priority Data

Mar. 16, 2016    (JP) .................................. 2016-052436

(51) Int. Cl.
*H01S 5/183* (2006.01)
*H01S 5/02* (2006.01)
(Continued)

(52) U.S. Cl.
CPC .......... *H01S 5/0206* (2013.01); *H01S 5/0425* (2013.01); *H01S 5/183* (2013.01);
(Continued)

(58) Field of Classification Search
CPC ............. H01S 5/18311; H01S 5/18313; H01S 5/18308; H01S 2304/00; H01S 2304/02; H01S 2304/025; H01S 5/183; H01S 5/18394; H01S 5/3013; H01S 5/3202; H01S 5/423
See application file for complete search history.

(56) References Cited

U.S. PATENT DOCUMENTS 6,297,172 B1 * 10/2001 Kashiwagi ........ H01L 21/02238
  257/E21.285
2009/0233453 A1 * 9/2009 Mani .................. H01L 21/0223
  438/772

(Continued)

FOREIGN PATENT DOCUMENTS

JP    2008-028370    2/2008

*Primary Examiner* — Allen Parker
*Assistant Examiner* — Frederick B Hargrove
(74) *Attorney, Agent, or Firm* — Smith, Gambrell & Russell, LLP.

(57) ABSTRACT

A method for fabricating a surface emitting laser includes the steps of: preparing a processing apparatus with a first part and a second part, the processing apparatus including a first heater and a second heater that heat the first part and the second part, respectively; preparing a wafer product for forming a surface emitting laser, the wafer product including a semiconductor post including a III-V compound semiconductor layer containing aluminum as a constituent element, the III-V compound semiconductor layer being exposed at a side face of the semiconductor post; after disposing the wafer product in the second part, energizing the first heater and the second heater; supplying a first gas containing no oxidizing agent to the processing apparatus; and after stopping supplying the first gas, oxidizing the III-V compound semiconductor layer by supplying a second gas containing an oxidizing agent to the processing apparatus.

19 Claims, 12 Drawing Sheets

(51) Int. Cl.
*H01S 5/30* (2006.01)
*H01S 5/042* (2006.01)
*H01S 5/20* (2006.01)
*H01S 5/343* (2006.01)

(52) U.S. Cl.
CPC ........ *H01S 5/18344* (2013.01); *H01S 5/2086* (2013.01); *H01S 5/3013* (2013.01); *H01S 5/18311* (2013.01); *H01S 5/3432* (2013.01); *H01S 2301/176* (2013.01)

(56) References Cited

U.S. PATENT DOCUMENTS

2015/0255955 A1* 9/2015 Wang .................... H01S 5/0224
 438/29
2015/0364320 A1* 12/2015 Riaziat .............. H01L 21/02241
 438/773

* cited by examiner

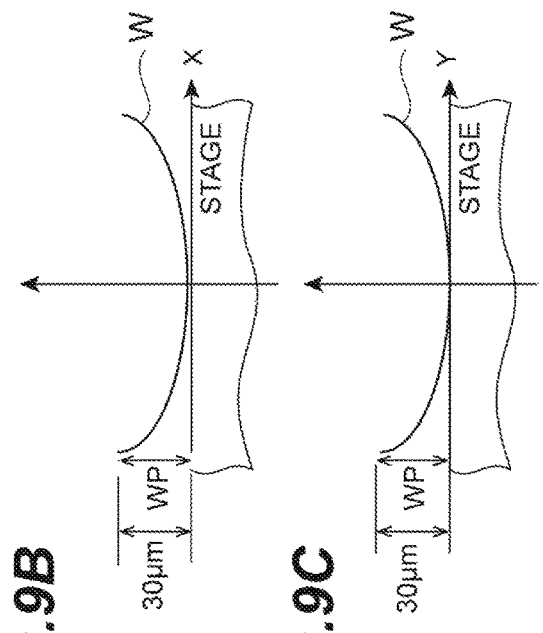
*Fig.9B*
*Fig.9C*
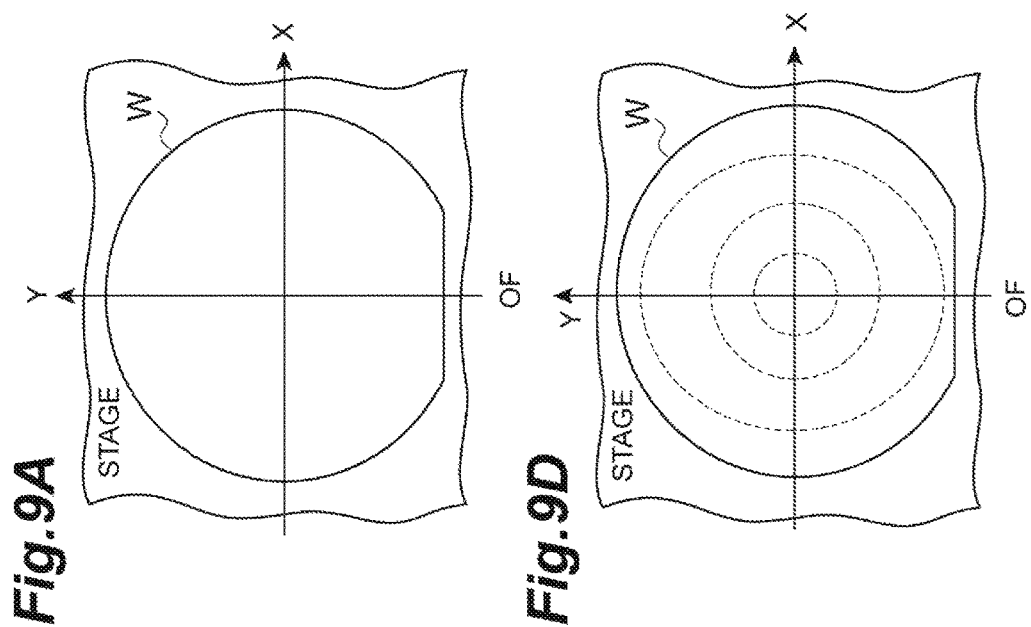
*Fig.9A*
*Fig.9D*

METHOD FOR FABRICATING SURFACE EMITTING LASER

BACKGROUND OF THE INVENTION

Field of the Invention

The present invention relates to a method for fabricating a surface emitting laser. This application claims the benefit of priority from Japanese Patent Application No. 2016-052436 filed on Mar. 16, 2016, which is herein incorporated by reference in its entirety.

Related Background Art

Patent Document 1 (Japanese Patent No. 5034662, or Japanese Patent Application Laid-Open No. 2008-028370) discloses a surface emitting laser and a method of fabricating the same.

SUMMARY OF THE INVENTION

A vertical cavity surface emitting laser includes a semiconductor post in which a laser cavity is included, and the semiconductor post includes two stacked semiconductor layers constituting respective distributed Bragg reflectors and a quantum well structure constituting an active layer provided between these stacked semiconductor layers. In the fabrication of the vertical cavity surface emitting laser, an epitaxial substrate is fabricated, and the epitaxial substrate includes thick semiconductor laminates for the above vertical cavity surface emitting laser. The semiconductor laminates of the epitaxial substrate are etched to form an array of semiconductor posts on the wafer. Each semiconductor post is oxidized in an oxidation furnace to form a current confinement structure therein. The current confinement structure closely relates to the performance of the vertical cavity surface emitting laser. In the oxidation process, the current confinement structure is formed in the semiconductor post. Specifically, in the oxidation process after forming the array of semiconductor posts, the wafer is placed on the support face of the temperature-controlled hot plate in the oxidation furnace, and is exposed to an oxidizing atmosphere. Inventor's studies reveal that variation in the current confinement structure in such an oxidation method is larger than the temperature distribution over the support face of the hot plate. It is experimentally found that the epitaxial substrate has a warpage. It is experimentally found that this warpage of the epitaxial substrate is a cause of variations in the current confinement structure. It is also found that this warpage of the epitaxial substrate is due to the structure of the thick semiconductor laminate for forming the vertical cavity surface emitting laser having the thick semiconductor laminate.

A method for fabricating a surface emitting laser according to an aspect of the present invention includes the steps of: preparing a processing apparatus with a first part and a second part, the processing apparatus including a first heater and a second heater that heat the first part and the second part, respectively; preparing a wafer product for forming a surface emitting laser, the wafer product including a semiconductor post including a III-V compound semiconductor layer containing aluminum as a constituent element, the III-V compound semiconductor layer being exposed at a side face of the semiconductor post; disposing the wafer product in the second part of the processing apparatus; after disposing the wafer product in the second part, energizing the first heater and the second heater; after disposing the wafer product in the second part, supplying a first gas containing no oxidizing agent to the processing apparatus; and after stopping supplying the first gas, oxidizing the III-V compound semiconductor layer by supplying a second gas containing an oxidizing agent to the processing apparatus.

The above-described objects and the other objects, features, and advantages of the present invention become more apparent from the following detailed description of the preferred embodiments of the present invention proceeding with reference to the attached drawings.

BRIEF DESCRIPTION OF THE DRAWINGS

FIGS. 9A, 9B, 9C, and 9D are schematic diagrams showing warped wafer products and the in-plane temperature distributions thereof.

DESCRIPTION OF THE EMBODIMENTS

Figure 1:
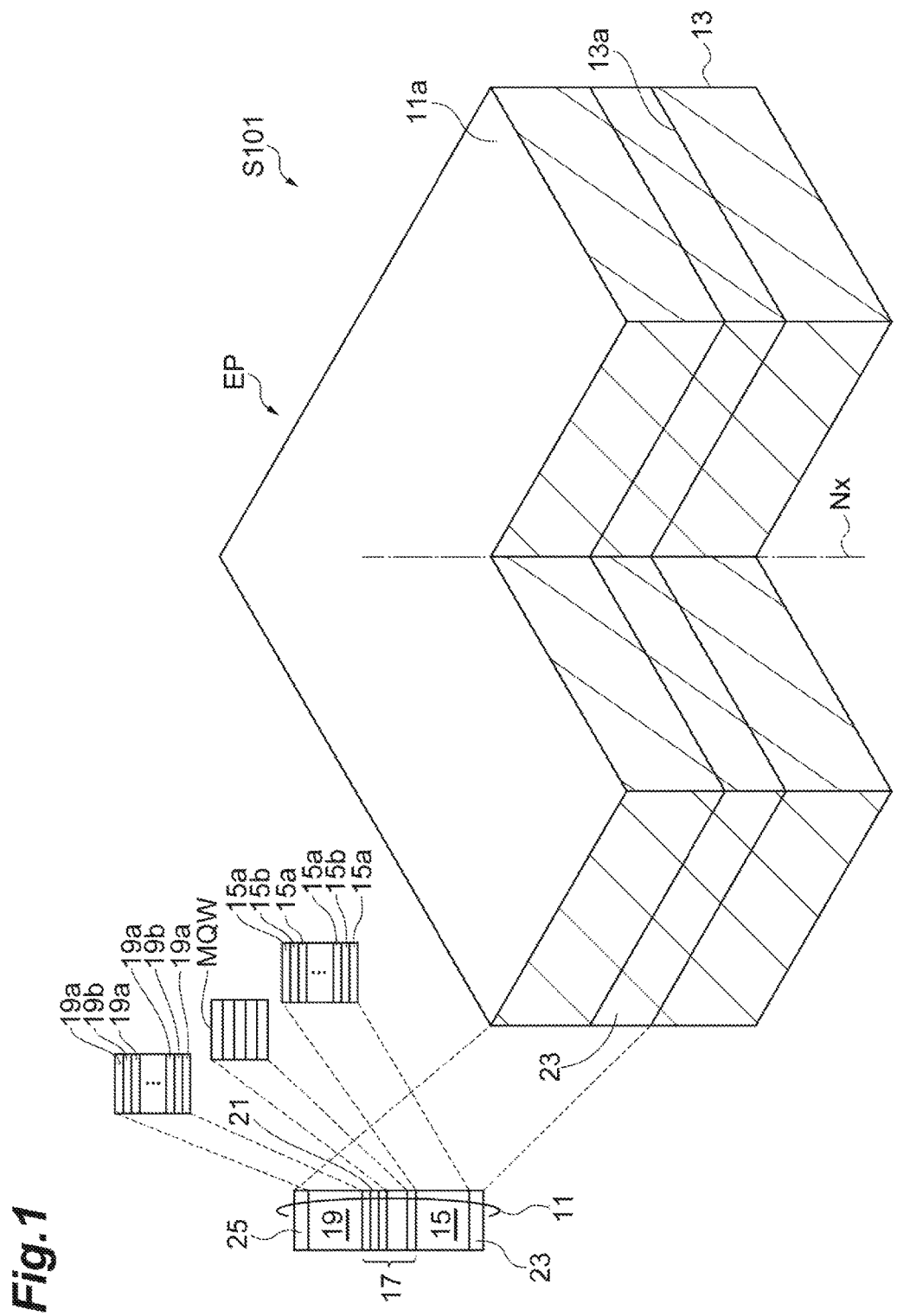
FIG. 1 is a schematic view showing a major step in a method for fabricating a surface emitting laser according to the present embodiment.

Specific embodiments according to the above aspects are described below.

A method for fabricating a surface emitting laser according to an embodiment includes the steps of: (a) preparing a processing apparatus with a first part and a second part, the processing apparatus including a first heater and a second heater that heat the first part and the second part, respectively; (b) preparing a wafer product for forming a surface emitting laser, the wafer product including a semiconductor post including a III-V compound semiconductor layer containing aluminum as a constituent element, the III-V compound semiconductor layer being exposed at a side face of the semiconductor post; (c) disposing the wafer product in the second part of the processing apparatus; (d) after disposing the wafer product in the second part, energizing the first heater and the second heater; (e) after disposing the wafer product in the second part, supplying a first gas containing no oxidizing agent to the processing apparatus; (f) and after stopping supplying the first gas, oxidizing the III-V compound semiconductor layer by supplying a second gas containing an oxidizing agent to the processing apparatus.

In the method for fabricating the surface emitting laser, the first gas is supplied to the processing apparatus with the first heater energized and the second heater energized, and the wafer product in the second part is exposed to the first gas. The wafer product includes the semiconductor post including the III-V compound semiconductor layer containing aluminum as a constituent element. The III-V compound semiconductor layer is exposed at the side face of the semiconductor post. The second heater and the first gas, which has been heated by the first heater, heat the front and back sides of the wafer product in the second part. Thereafter, the first gas is changed to the second gas, and the second gas thus supplied treats the wafer product. In this treatment, the oxidizing agent in the second gas processes the surface of the wafer product to oxidize the III-V compound semiconductor layer thereof. The wafer product, which includes thick semiconductor laminates for forming the surface emitting laser, may have a warpage. Heating both sides of the wafer product may provide the wafer product with an excellent in-plane uniformity of temperature in the surface thereof regardless of warpage.

In the method according to an embodiment, the first gas may contain at least one of helium or hydrogen.

In the method for fabricating the surface emitting laser, these gases exhibit good thermal conductivity.

In the method according to an embodiment, the second gas may contain water vapor for the oxidizing agent.

In the method for fabricating the surface emitting laser, the heated water vapor forms an oxide of aluminum contained as a group III constituent element in the III-V group compound semiconductor layer.

In the method according to an embodiment, the processing apparatus may have a horizontal type reactor.

In the method for fabricating the surface emitting laser, the gas-flow path is provided in a horizontal reactor.

In the method according to an embodiment, the processing apparatus may have a vertical type reactor.

In the method for fabricating the surface emitting laser, the gas-flow path is provided in a vertical reactor.

In the method according to an embodiment, preferably, the processing apparatus includes a stage disposed in the second part, the stage including a supporting face for supporting the wafer product. The stage includes the second heater.

In the method of fabricating the surface emitting laser, the stage having the second heater may adjust the temperature of the wafer product through the support face of the stage because the wafer product is in contact with the support face of the stage.

Teachings of the present invention can be readily understood by considering the following detailed description with reference to the accompanying drawings shown as examples. Referring to the accompanying drawings, embodiments of a method for fabricating a surface emitting laser according to the present invention will be described. To facilitate understanding, identical reference numerals are used, where possible, to designate identical elements that are common to the figures.

With reference to FIGS. 1 to 12, an exemplary method for fabricating a surface emitting laser will be described below. FIGS. 1 to 5 and 10 to 12 each show a single device section of the surface emitting laser to be fabricated. The present embodiment describes the fabrication of, for example, a vertical cavity surface emitting laser (VCSEL).

In step S101, as shown in FIG. 1, an epitaxial substrate EP for fabricating a surface emitting laser is prepared. The epitaxial substrate EP includes a laminate 11 and a substrate 13, and the laminate 11 is disposed on a principal surface 13a of the substrate 13. In the embodiment, the laminate 11 serves as a semiconductor laminate. The laminate 11 includes a first stacked semiconductor layer 15 constituting a first distributed Bragg reflector, a semiconductor region 17 constituting an active layer, and a second stacked semiconductor layer 19 constituting the second distributed Bragg reflector. The first stacked semiconductor layer 15, the semiconductor region 17 and the second stacked semiconductor layer 19 are arranged in the direction of an axis Nx normal to the principal surface 13a of the substrate 13. The semiconductor region 17 includes a quantum well structure MQW serving as the active layer for light emission. The semiconductor region 17 may include, for example, an Al-based III-V semiconductor layer 21 for forming a current confinement structure. If necessary, the laminate 11 of the epitaxial substrate EP may include a buffer layer 23 and/or an upper contact layer 25. Specifically, the buffer layer 23 is disposed between the first stacked semiconductor layer 15 and the substrate 13, and the upper contact layer 25 is disposed on the second stacked semiconductor layer 19. In the present embodiment, in order to prepare the epitaxial substrate EP, an epitaxial substrate EP is produced in the following process. The substrate 13 is prepared for growing semiconductor layers thereon by using an epitaxial growth method. The substrate 13 may include a semiconductor wafer, such as, a GaAs wafer. The laminate 11 is grown on the principal surface 13a of the substrate 13 by using, for example, a molecular beam epitaxy method and/or a metal-organic vapor phase epitaxy method to form the epitaxial substrate EP. The first stacked semiconductor layer 15 in the laminate 11 includes first semiconductor layers 15a and second semiconductor layers 15b, which are alternately arranged in the direction of the normal axis Nx so as to form one distributed Bragg reflector.

The second stacked semiconductor layer 19 in the laminate 11 includes third semiconductor layers 19a and fourth semiconductor layers 19b, which are alternately arranged in the direction of the normal axis Nx so as to form the other distributed Bragg reflector.

An exemplary epitaxial substrate EP.
Substrate 13: GaAs.
Thickness of the substrate 13: 400 to 700 micrometers.
First stacked semiconductor layer 15: GaAs/AlGaAs superlattice.
First semiconductor layer 15a: GaAs.
Second semiconductor layer 15b: AlGaAs.
Semiconductor region 17.
Quantum well structure MQW: GaAs/AlGaAs, InGaAs/AlGaAs, or AlGaInAs/AlGaAs.
Al-based III-V semiconductor layer 21: AlGaAs.
Thickness of III-V semiconductor layer 21: 5 to 10 nm.
Al composition of the III-V semiconductor layer 21: 0.9 to 1.
Second stacked semiconductor layer 19: GaAs/AlGaAs superlattice.
Third semiconductor layer 19a: GaAs.
Fourth semiconductor layer 19b: AlGaAs.
Upper contact layer 25: GaAs.
Buffer layer 23: GaAs.
The thickness of the laminate 11: 6 to 8 micrometers.

Figure 2:
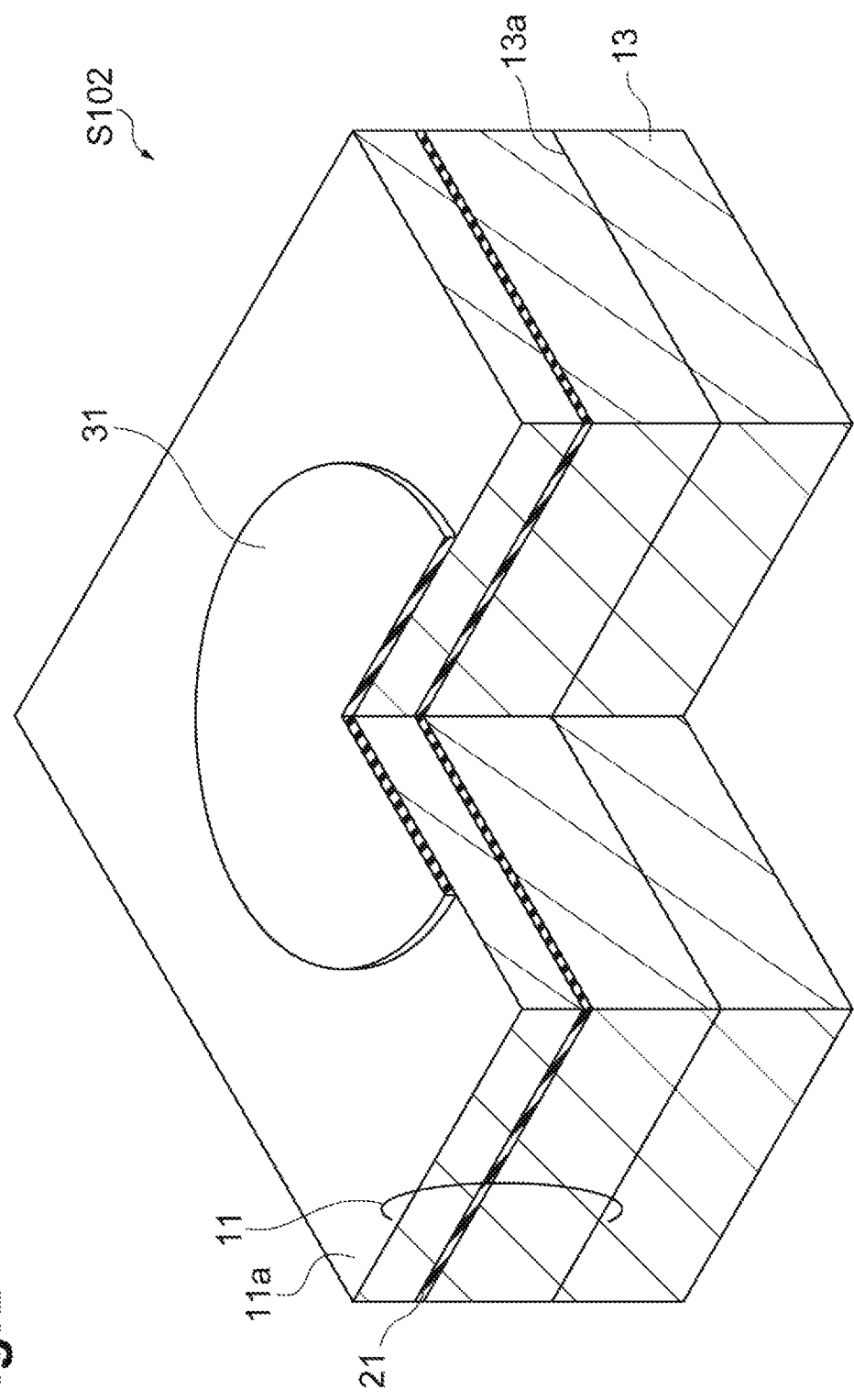
FIG. 2 is a schematic view showing a major step in the method of fabricating the surface emitting laser according to the present embodiment.

In step S102, as shown in FIG. 2, a mask 31 is formed on the epitaxial substrate EP. The mask 31 defines a shape of a semiconductor post in which the optical cavity is formed. In order to fabricate the mask 31, an inorganic insulating film (silicon-based inorganic insulating film, such as silicon oxide film, silicon nitride film, and silicon oxynitride film) is formed on a principal surface 11a of the laminate 11 of the epitaxial substrate EP. The inorganic insulating film is processed by using the photolithography method and the etching technique to form the mask 31 having a pattern for forming the semiconductor post.

Figure 3:
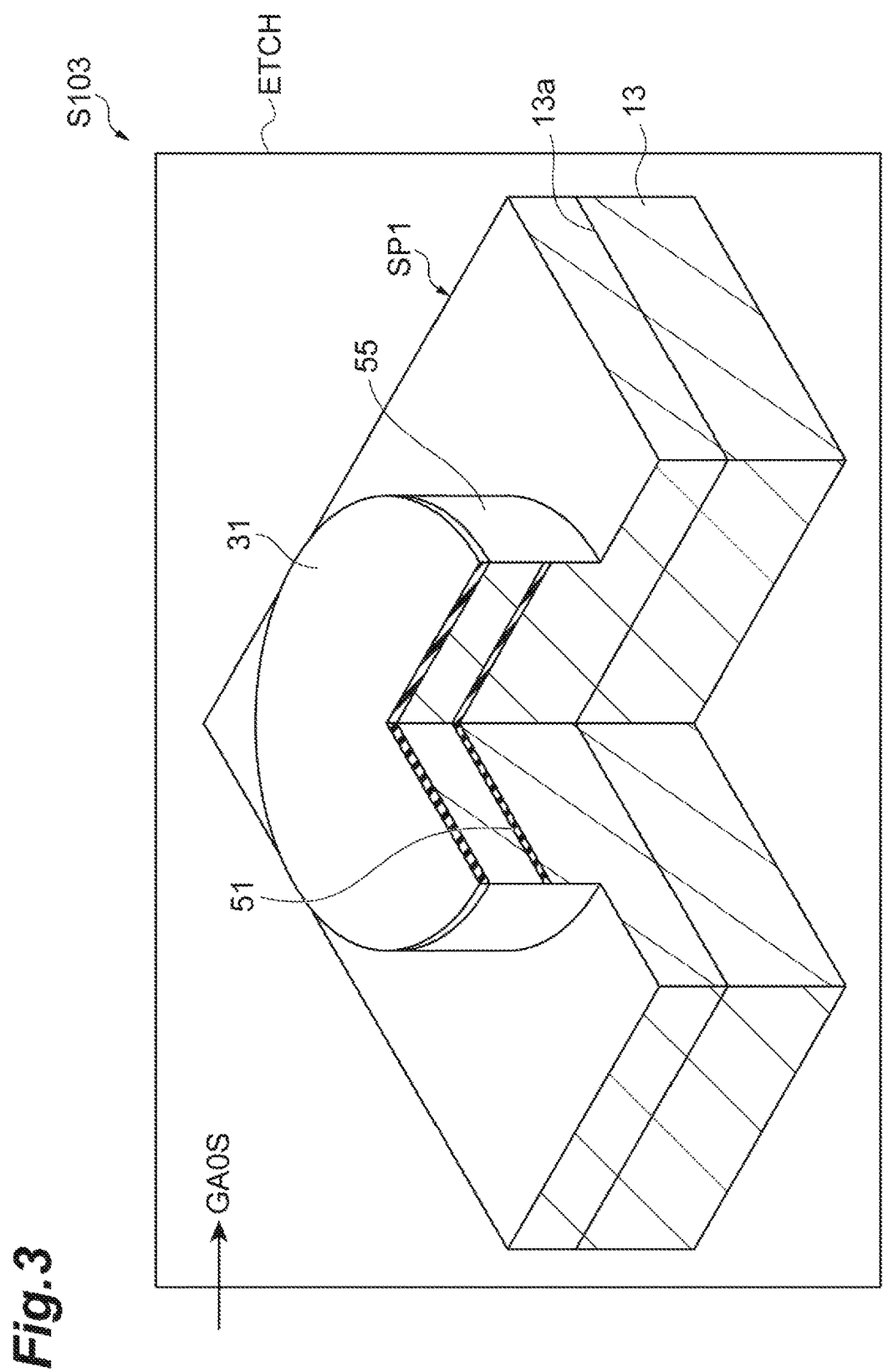
FIG. 3 is a schematic view showing a major step in the method for fabricating the surface emitting laser according to the present embodiment.

In step S103, the semiconductor post is formed from the laminate 11 with the mask 31. As shown in FIG. 3, the epitaxial substrate EP is disposed in a chamber of an etching apparatus ETCH. The chamber of the etching apparatus ETCH is evacuated by using an evacuation pump to obtain a desired degree of vacuum in the chamber. After the vacuum evacuation is completed, a first gas GA1S containing process gas and etchant is supplied to the chamber. The etchant includes boron chloride and may further contain chlorine. The process gas may include hydrogen and/or helium. The etching apparatus ETCH includes an inductively-coupled plasma reactive ion etching (ICP-RIE) etcher. The inductively-coupled plasma reactive ion etcher (ICP-RIE) includes a chamber, a lower electrode, an inductive-coupling coil, a first radio frequency power supply, and a second radio frequency power supply. The chamber includes a dielectric dome, and an inductive-coupling coil is provided outside of the dielectric dome of the chamber. The lower electrode is provided in the chamber. The epitaxial substrate EP is placed on the lower electrode. The first radio frequency power supply is coupled to the lower electrode, and the second radio frequency power supply is coupled to the inductive-coupling coil. If necessary, the lower electrode is connected to a cooler for controlling the temperature of the substrate placed thereon in the etching process.

After the epitaxial substrate EP is placed on the lower electrode in the chamber of the etching apparatus ETCH, an etching gas GA0S containing boron chloride and chlorine is supplied to the etching apparatus ETCH as an etchant to etch the epitaxial substrate EP by using plasma etching method. The etchant etches the laminate 11 to transfer the pattern of the mask 31 thereto. In the former half of the etching, the second stacked semiconductor layer 19 and the semiconductor region 17 are processed, and in the latter half of the etching, the first stacked semiconductor layer 15 is processed, so that the plasma etching in the former and latter halves forms the etched laminate 1, which has desired semiconductor posts 55. This etching forms a substrate product SP1. The substrate product SP1 includes the substrate 13 and a semiconductor structure 53. The semiconductor structure 53 includes the semiconductor posts 55.

Figure 4:
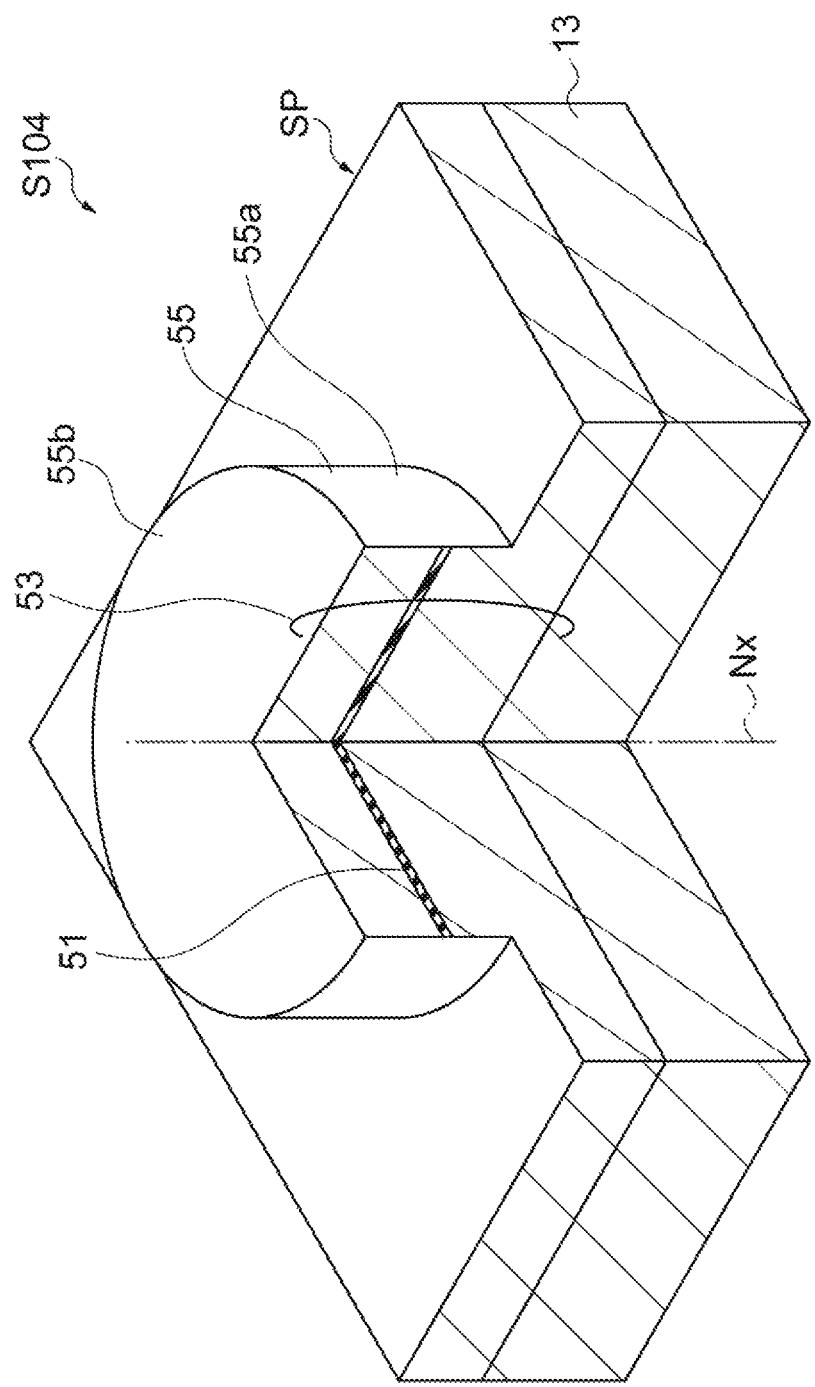
FIG. 4 is a schematic view showing a major step in the method for fabricating the surface emitting laser according to the present embodiment.

The etching process fabricates the arrangement of the semiconductor posts 55. After removing the substrate product SP1 from the etching apparatus ETCH, in step S104, the mask 31 is removed as shown in FIG. 4. The etching produces the wafer product SP from the epitaxial substrate EP. The wafer product SP includes the substrate 13 and the semiconductor structure 53, which includes the semiconductor posts 55. The semiconductor posts 55 each includes a first distributed Bragg reflector, an active layer, and a second distributed Bragg reflector, which are produced from the epitaxial structure in the epitaxial substrate EP. The first distributed Bragg reflector, the active layer, and the second distributed Bragg reflector are arranged in the direction of the normal axis Nx. Each of the semiconductor posts 55 includes a side face 55a extending in the direction of the normal axis Nx, and an upper face 55b extending along the plane that intersects with the direction of the normal axis Nx. The side face 55a includes the side of each of the semiconductor layers in the first distributed Bragg reflector, the active layer, and the second distributed Bragg reflector. The side of each of the semiconductor layers in the first distributed Bragg reflector, the active layer, and the second distributed Bragg reflector is exposed at the side face 55a of the semiconductor post. These semiconductor layers are formed from the first stacked semiconductor layer 15, the semiconductor region 17 (a quantum well structure MQW, a III-V semiconductor layer 21), the second stacked semiconductor layer 19, the buffer layer 23 and the upper contact layer 25, which are included in the laminate 11. In FIG. 4, the compound semiconductor layer 51 formed from the III-V semiconductor layer 21 is drawn. The compound semiconductor layer 51 is in the semiconductor post 55. The quantum well structure MQW is provided between the upper distributed Bragg reflector and the lower distributed Bragg reflector. The compound semiconductor layer 51 is disposed between the quantum well structure MQW and the upper distributed Bragg reflector. The semiconductor post is fabricated by etching so as to form the wafer product SP for forming the surface emitting laser.

Figure 5:
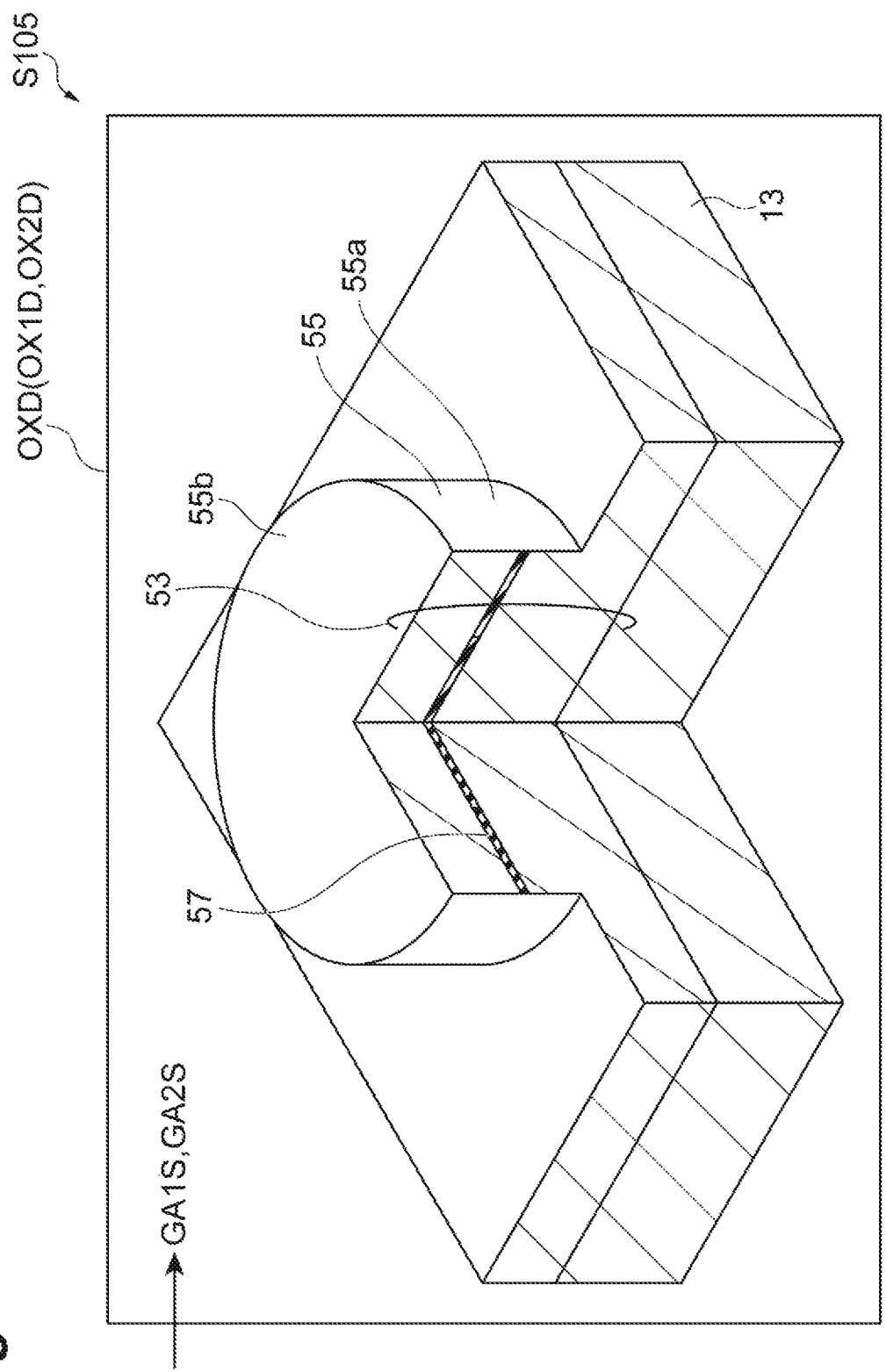
FIG. 5 is a schematic view showing a major step in the method for fabricating the surface emitting laser according to the present embodiment.

In step S105, as shown in FIG. 5, the wafer product SP is subjected to an oxidizing atmosphere to form the current confinement structure 57. Partial oxidation of the compound semiconductor layer 51 may form the current confinement structure 57. An exemplary oxidation is carried out as follows. The wafer product SP is placed on the support of the processing apparatus OXD. The support of the processing apparatus OXD includes a heater capable of heating the back surface of the wafer product SP that is placed on the support. The first gas GA1S containing no oxidizing agent is preliminarily heated upstream of the gas flow path to obtain a desired atmosphere. This atmosphere heats the front surface of the wafer product SP on the support which is located downstream of the gas flow path. The wafer product SP is heated from both sides thereof. After the preliminary heating is completed, the second gas GA2S containing process gas and oxidant is supplied in the chamber of the processing apparatus OXD. The second gas GA2S is preheated upstream of the gas flow path to obtain a desired atmosphere. The atmosphere makes contact with the wafer product SP disposed on the support downstream of the gas flow path. In the wafer product SP, the semiconductor post 55 includes the compound semiconductor layer 51 including an AlGaAs layer having a high Al composition. The compound semiconductor layer 51 is provided between the active layer and the upper DBR structure. In the wafer product SP placed in an oxidizing atmosphere, the AlGaAs layer (the etched III-V semiconductor layer 21) of the compound semiconductor layer 51 in the semiconductor post 55 is partially oxidized from the side face 55a of the semiconductor post 55 to form an aluminum oxide layer 57a. The semiconductor window layer 57b (an AlGaAs layer), which is not oxidized, remains inside of the aluminum oxide layer 57a. The aluminum oxide layer 57a surrounds the semiconductor window layer 57b made of AlGaAs. The aluminum oxide layer 57a makes it possible to confine the current in the semiconductor window layer 57b. The oxidizing atmosphere includes, for example, high temperature steam (e.g., 300 to 400 degrees Celsius), and the preheating atmosphere includes, for example, high temperature hydrogen and/or helium (e.g. 300 to 400 degrees Celsius).

EXAMPLE

Figure 6:
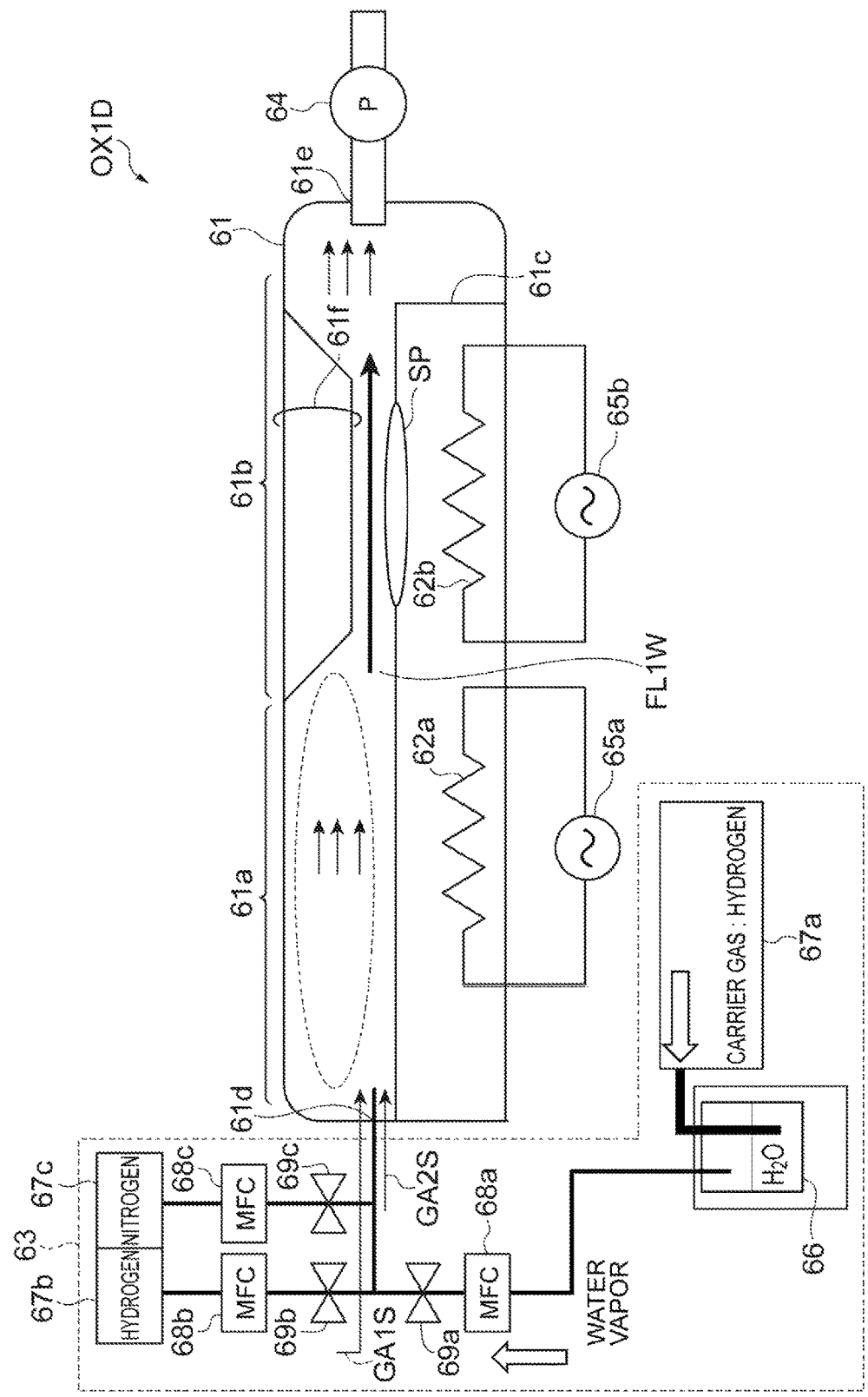
FIG. 6 is a schematic view showing an exemplary processing apparatus shown in FIG. 5.

The processing apparatus OXD shown in FIG. 5 will be described with reference to FIGS. 6 and 7. Referring to FIG. 6, a processing apparatus OX1D is prepared as an example of the processing apparatus OXD. The processing apparatus OX1D shown in FIG. 6 includes a so-called horizontal-type furnace. The processing apparatus OX1D includes a chamber 61, a first heater 62a, a second heater 62b, a gas introduction system 63, an exhaust system 64, a first heater power supply 65a, and a second heater power supply 65b. The chamber 61 includes a first portion 61a and a second portion 61b, which are arranged in a direction from the upstream to the downstream of the gas flow path FL1W. Further, the chamber 61 has a stage 61c in the second portion 61b for supporting the wafer. The processing apparatus OX1D provides the gas flow path FL1W in the horizontal furnace. The gas introduction system 63 is connected to the inlet port 61d in the upstream of the chamber 61, and the exhaust system 64 is connected to an exhaust port 61e in the downstream of the chamber 61. The first heater 62a is disposed to heat the first portion 61a of the chamber 61 and is connected to the first heater power supply 65a. The second heater 62b is disposed to heat the second portion 61b of the chamber 61 and is connected to the second heater power supply 65b. In the horizontal furnace, if necessary, the flow path guide 61f is formed in the second portion 61b such that the cross sectional area of the second portion 61b in the gas flow path FL1W may be made smaller than that of the first portion 61a. Accordingly, the difference in cross-sectional area in the flow path may increase the gas flow rate. This allows the steam to flow toward the exhaust port 61e quickly through the gas flow path FL1W. The convection of the steam gas on the wafer is suppressed. As a result, the uniformity of the temperature distribution in the wafer is improved. The gas introduction system 63 includes a carrier gas source 67a (for example, $H_2$ and/or He) for bubbling, a hydrogen source 67b of a process gas source, and a nitrogen source 67c. The carrier gas source 67a is connected to the inlet of a bubbler 66 containing purified water therein, and the outlet of the bubbler 66 is connected to the inlet port 61d via a first mass flow controller 68a (MFC) and the first valve 69a. The hydrogen source 67b in the process gas source is connected to the inlet port 61d via a second mass flow controller 68b and the second valve 69b, and the nitrogen source 67c is connected via a third mass flow controller 68c and the third valve 69c to the inlet port 61d. The first valve 69a, the second valve 69b, and the third valve 69c are used to switch the oxidizing agent, the heating gas, and the process gas, respectively. The first mass flow controller 68a, the second mass flow controller 68b, and the third mass flow controller 68c are used to adjust the respective gas flow rates.

Figure 7:
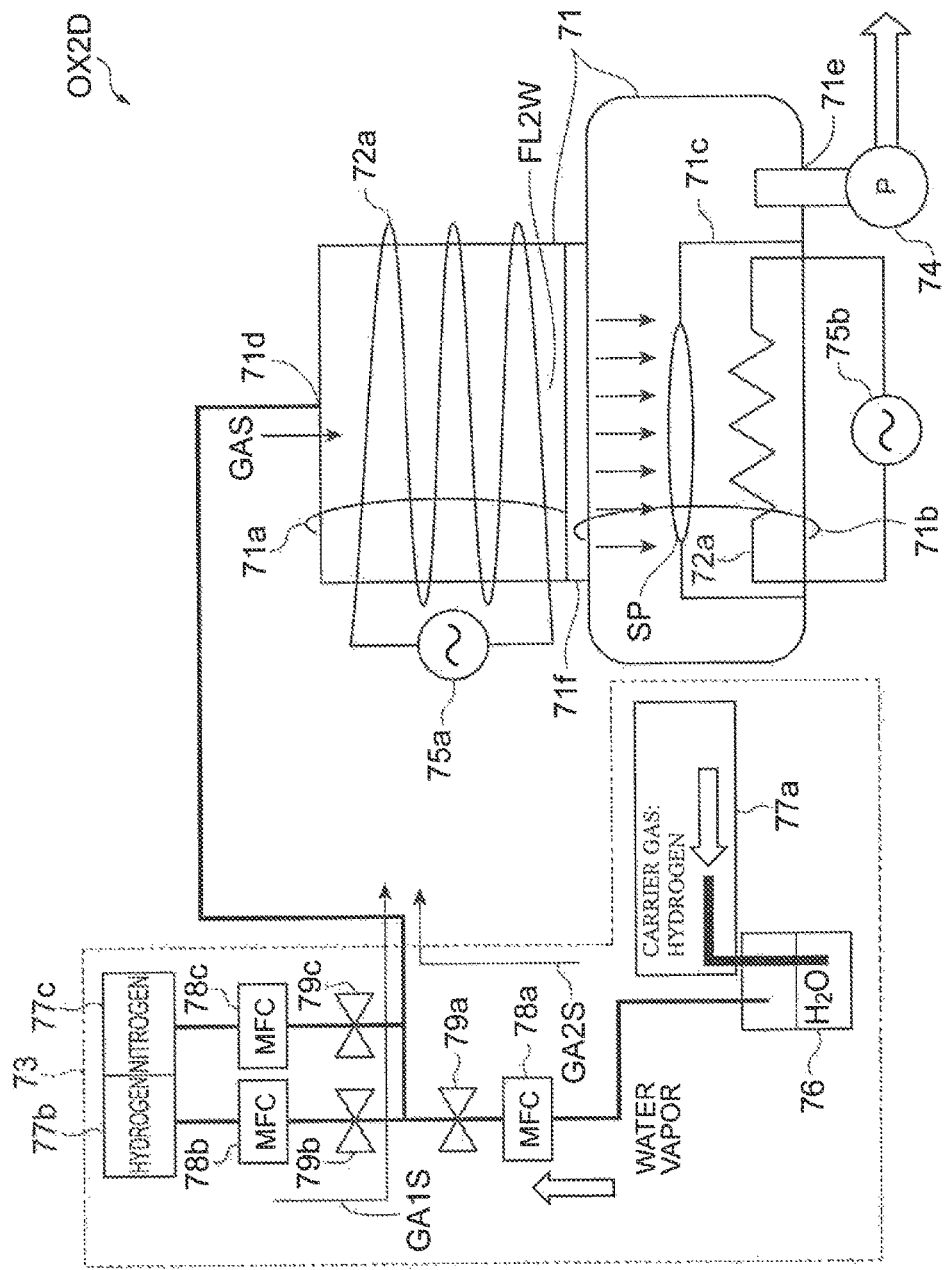
FIG. 7 is a schematic view showing another exemplary processing apparatus shown in FIG. 5.

Referring to FIG. 7, a processing apparatus OX2D is prepared as an example of the processing apparatus OXD. FIG. 7 shows the processing apparatus OX2D, which includes a so-called vertical-type furnace. The processing apparatus OX2D includes a chamber 71, a first heater 72a, a second heater 72b, a gas introduction system 73, an exhaust system 74, a first heater power supply 75a, and a second heater power supply 75b. The chamber 71 includes a first portion 71a and a second portion 71b, which are arranged in the direction from the upstream of the gas flow path FL2W to the downstream thereof. Further, the chamber 71 has a stage 71c in the second portion 71b for supporting the wafer. The processing apparatus OX2D provides the gas flow path FL2W in a vertical-type furnace. The gas introduction system 73 is connected to the inlet port 71d in the upstream of the chamber 71, and the exhaust system 74 is connected to the outlet port 71e in the downstream of the chamber 71. The first heater 72a is disposed to heat the first portion 71a of the chamber 71 and is connected to the first heater power source 75a. The second heater 72b is provided to heat the second portion 71b of the chamber 71 and is connected to the second heater power source 75b. In the vertical furnace, the first heater 72a heats the first gas GA1S and the second gas GA2S which pass through the first portion 71a, and the first gas GA1S and the second gas GA2S thus heated are supplied to the second portion 71b via a shower head 71f. The gas flow path FL2W extends in the direction that intersects with a principal surface of the wafer product, which is to be processed in the vertical furnace. The gas introduction system 73 includes a carrier gas source 77a (for example, $H_2$ and/or He) for bubbling, and a hydrogen source 77b and a nitrogen source 77c, each of which works as a process gas source. The carrier gas source 77a is connected to the inlet of a bubbler 76 containing purified water, and the outlet of the bubbler 76 is connected to the inlet port 71d via the first mass flow controller 78a (MFC) and the first valve 79a. The hydrogen source 77b of the process gas source is connected to the inlet port 71d via the second mass flow controller 78b and the second valve 79b, and the nitrogen source 77c is connected to the introduction port 71d via the third mass flow controller 78c and the third valve 79c. The first valve 79a, the second valve 79b, and the third valve 79c are used to switch the oxidizing agent, the heating gas, and the process gas, respectively. The first mass flow controller 78a, the second mass flow controller 78b, and the third mass flow controller 78c are used to adjust the respective gas flow rates.

Figure 8:
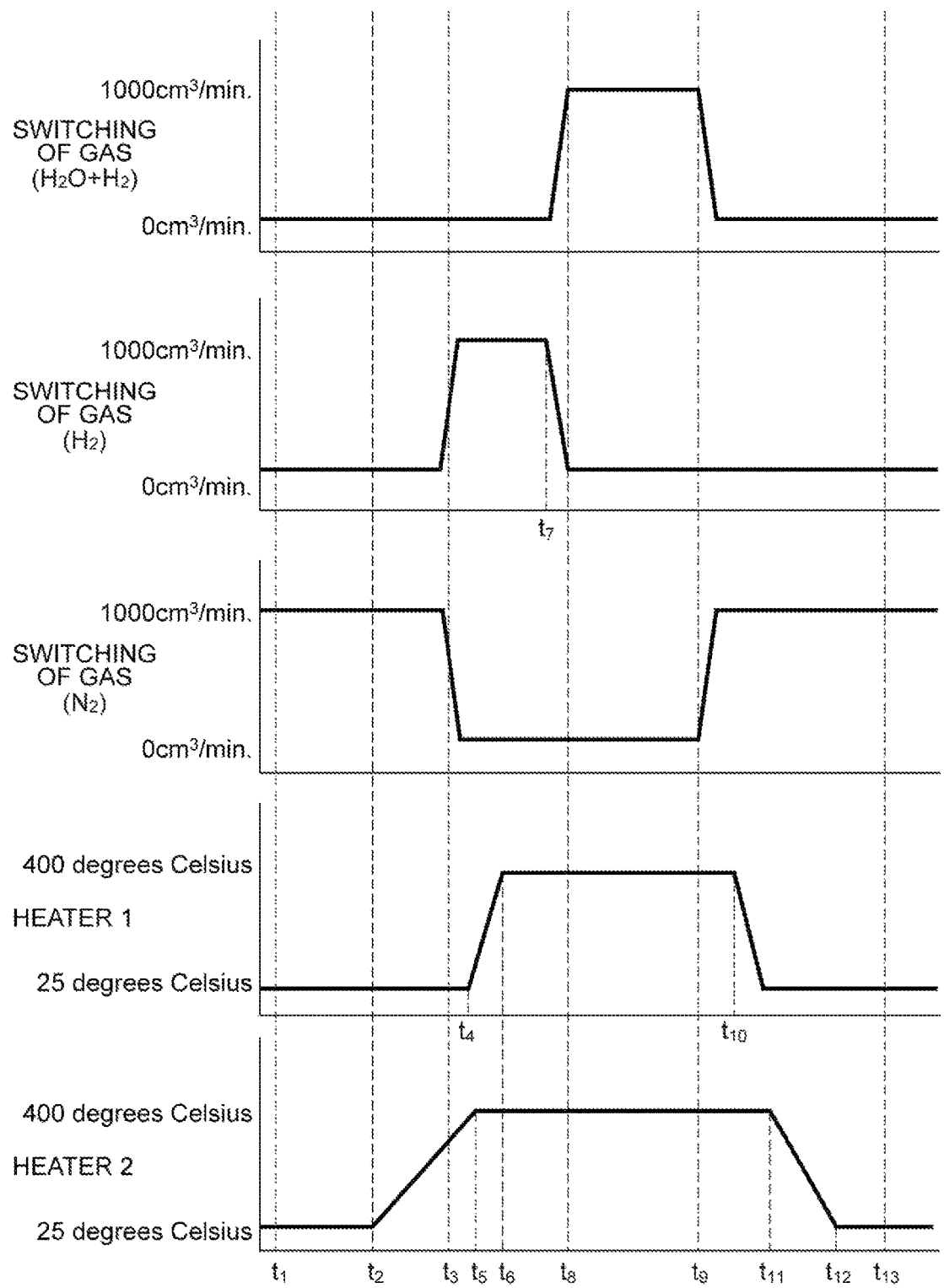
FIG. 8 is a time chart showing the gas flow and the temperature profiles of the first and second heaters.

FIG. 8 shows the gas flow and the temperature profiles of the first heater and the second heater. The first mass flow controller 68a, the second mass flow controller 68b, and the third mass flow controller 68c regulate the respective gas flow rates. The first valve 69a, the second valve 69b, and the third valve 69c switch the respective gas flows. Using such a processing apparatus OXD allows the formation of a current confinement structure 57 of the wafer product SP using an oxidizing atmosphere in the process flow shown in FIG. 8. At time t1, the wafer product SP is loaded into the processing apparatus OXD and placed on the stage of the second part of the chamber, and the chamber is evacuated with process gas (e.g., nitrogen) flowing to control the pressure in the chamber.

The wafer product SP is disposed in the processing apparatus OXD, and the first heater is energized and the second heater is energized. Specifically, these energizations are performed as follows. At time t2, the second heater is fed to start the temperature increase thereof for heating the wafer product SP in the second part of the chamber. The rate of temperature rise of the second heater is, for example, 10 degrees/min.

A first gas for heating the wafer product SP is supplied to the processing apparatus OXD with the wafer product SP placed in the processing apparatus OXD. The first gas does not contain any oxidizing agent. Specifically, at time t3, the process gas (e.g., nitrogen) is changed to the first gas for heating (for example, $H_2$ and/or He). After the replacement of gas has been completed in the chamber, the first heater is fed at time t4 to heat gas passing through the first portion of the chamber. The wafer product SP is placed in not the first part but the second part, and the temperature rise speed of the second heater is lower than that of the first heater. The rate of temperature rise in the first heater is, for example, 50 degrees/min. The temperature of the second heater is made sufficiently stable at the time when the switching of the gas (replacement of nitrogen with hydrogen) is completed or in a time zone in which energization of the first heater is started (for example, at time t5). At time t6, both the temperatures of the first and second heaters are made sufficiently stable.

At time t7, the temperature of the wafer product SP is made substantially uniform on the in-plane directions. In the processing apparatus OXD, the first gas is stopped and the second gas is started to be supplied to the processing apparatus OXD to process the wafer product SP. The second gas contains an oxidizing agent (e.g., high-temperature steam). Specifically, in the time period from the time t7 to the time t8, switching of the gas (replacement of hydrogen with steam) is promptly performed with the energization of the first heater and the second heater maintained. At time t8, the replacement is completed to perform an oxidation, process. In the first part of the chamber, the water vapor is heated to the desired temperature, and in the second part of the chamber, the water vapor thus heated makes contact with the wafer product SP. The wafer product SP having semiconductor posts is heated with high uniformity in in-plane temperature, and makes contact with the water vapor (oxidizing agent) preheated in the first part. The water vapor thus preheated allows oxidation of the posts to progress at 400 degrees Celsius. The oxidation temperature (in the embodiment, the temperature of the second heater) may range, for example, from 300 to 400 degrees Celsius. Alternatively, the temperature of the first heater may be different from the temperature of the second heater within a temperature range allowing the wafer product to be heated, and this range in the temperature of the first heater may be within −10 to +10 degrees with respect to the temperature of the second heater.

In order to stop the oxidation, supplying the second gas in the processing apparatus OXD is stopped. Specifically, at time t9, gas purging (replacing water vapor with nitrogen) is performed promptly with the energizations of the first heater and the second heater maintained. After stopping the supply of the second gas to terminate the oxidation, the temperature of the wafer product SP is lowered. At time t10, the current supplied to the first heater is reduced to lower the temperature of the first heater gradually. The temperature lowering rate of the first heater is, for example, 50 degrees/min. The temperature of the gas flowing through the first portion decreases with the temperature of the first heater. The gas heated in the second part acts to lower the temperature of the wafer product SP placed in the second part. Next, at time t11, the current of the second heater is reduced such that the temperature of the second heater is gradually lowered. The temperature lowering rate of the second heater is, for example, 10 degrees/min. The temperature of the wafer product SP placed on the second portion decreases with the temperature of the second heater. At time t12, the temperatures of the first and second heaters reach room temperature, for example, 25 degrees Celsius. At time t13, the oxidized wafer product SP is unloaded from the chamber of the processing apparatus OXD.

In the wafer product SP, a III-V compound semiconductor layer 51 containing aluminum with a high aluminum composition (for example, 0.9 or more) as a group III constituent element is exposed at the side face of the semiconductor post 55 in the wafer product. Specifically, the semiconductor post 55 includes the III-V compound semiconductor layer 51, and the side face of the III-V compound semiconductor layer 51 makes contact with high-temperature water vapor (oxidizing agent). The III-V compound semiconductor layer 51 in the semiconductor post 55 is gradually oxidized toward the inner portion of the semiconductor post 55 from the side thereof to change the constituent element Al of the semiconductor into an oxide of aluminum. The progress of oxidation is controlled by the temperature of the wafer product SP and the oxidation time. The in-plane temperature uniformity over the wafer product SP is, therefore, an important factor in the oxidation process.

The processing apparatus OXD includes stages 61c and 71c disposed in the second portions 61b and 71b, and the stages 61c and 71c include second heaters 62b and 72b, respectively. The stages 61c and 71c have respective support faces for supporting the wafer product SP. The temperature of the wafer product SP in contact with the support faces of the stages 61c and 71c is adjusted through the support faces of the stages 61c and 71c. The wafer product SP, however, has unknown and uncontrollable warpage. FIGS. 9A, 9B, 9C, and 9D are diagrams showing warpages and in-plane temperature distributions of the wafer product. FIG. 9A is a plan view showing a wafer product W (for example, the wafer has a diameter of 76 mm) placed on the stage of the oxidation furnace. FIGS. 9B and 9C are schematic cross sectional views showing respective warpages WP in two cross sections orthogonal to the principal surface of the wafer product W placed on the stage of the oxidation furnace. The warpages WP are about 30 micrometers. FIG. 9D is a schematic drawing showing the temperature distribution of the wafer product W in the case of the stage temperature of 400 degrees Celsius. In the central area RIN of the wafer product W, the temperature is about 400 degrees Celsius, and in the outer area ROUT outside the central area by 50 micrometers from the center of the wafer product W, the temperature is about 390 degrees Celsius.

In the fabricating method according to the present embodiment, the first gas is supplied to the processing apparatus OXD (OX1D, OX2D), with the first heaters 62a and 72a energized and the second heaters 62b and 72b energized. The wafer product SP is exposed to the first gas in the second portion 61b and 71b. The second heaters 62b and 72b and the first gas that is heated by the first heaters 62a and 72a heat the respective sides of the wafer product SP to adjust the temperature of the wafer products SP in the second portions 61b and 71b. After controlling the temperature of the wafer products SP, the gas supplied to the processing apparatus OXD is changed from the first gas to the second gas in order to process the wafer product SP. In the present process, the III-V compound semiconductor layer 51 is oxidized from the side face of the semiconductor post 55 in the wafer product SP inward by the oxidizing agent (for example, steam) contained in the second gas. The thick wafer product SP (comprising the first stacked semiconductor layer 15, the semiconductor region 17, the second stacked semiconductor layer 19) for forming the surface emitting laser may make the wafer product SP warped. Heating both sides of the wafer product SP may provide the wafer product SP with an excellent in-plane temperature uniformity over the wafer with or without wafer warpage.

The description of the fabricating method will follow the above embodiment.

Figure 10:
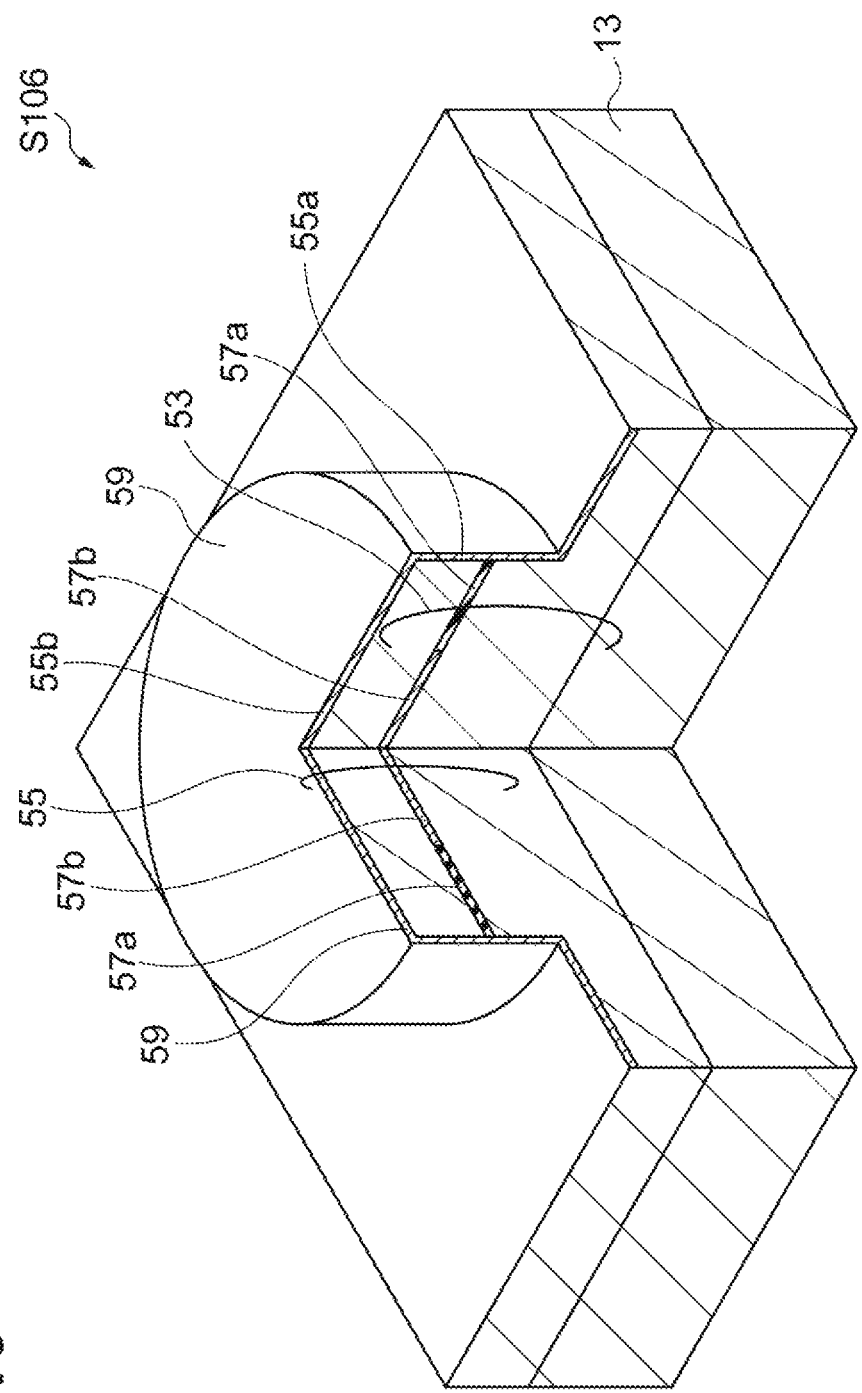
FIG. 10 is a schematic view showing a major step in the method for fabricating the surface emitting laser according to the present embodiment.

In step S106, after forming the current confinement structure, as shown in FIG. 10, the passivation film 59 is formed on the entire surface of the product. The passivation film 59 may be formed by, for example, a plasma CVD method, and includes a silicon-based inorganic insulating film, such as SiN film, SiON film, or $SiO_2$ film. The passivation film 59 may have a thickness adjusted so that the passivation film 59 works as a high reflection film with respect to the wavelength of light emitted from the surface emitting laser.

Figure 11:
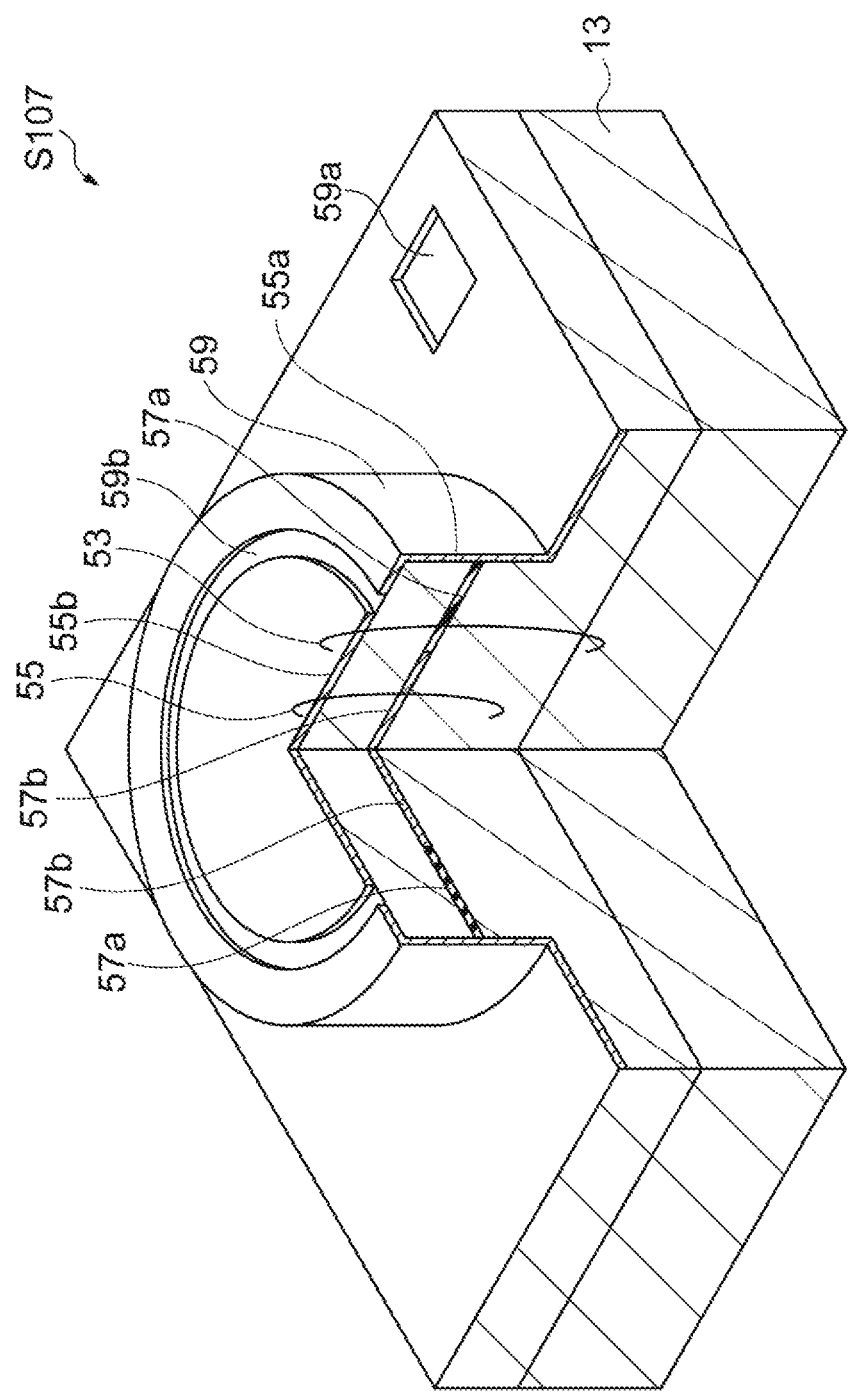
FIG. 11 is a schematic view showing a major step in the method for fabricating the surface emitting laser according to the present embodiment.

In step S107, after forming the passivation film 59, as shown in FIG. 11, the passivation film 59 is processed by etching and photolithography to form an opening(s) for formation of electrodes. In the present embodiment, the passivation film 59 includes a first opening 59a provided on the buffer layer and a second opening 59b provided on the upper surface 55b of the semiconductor post 55.

Figure 12:
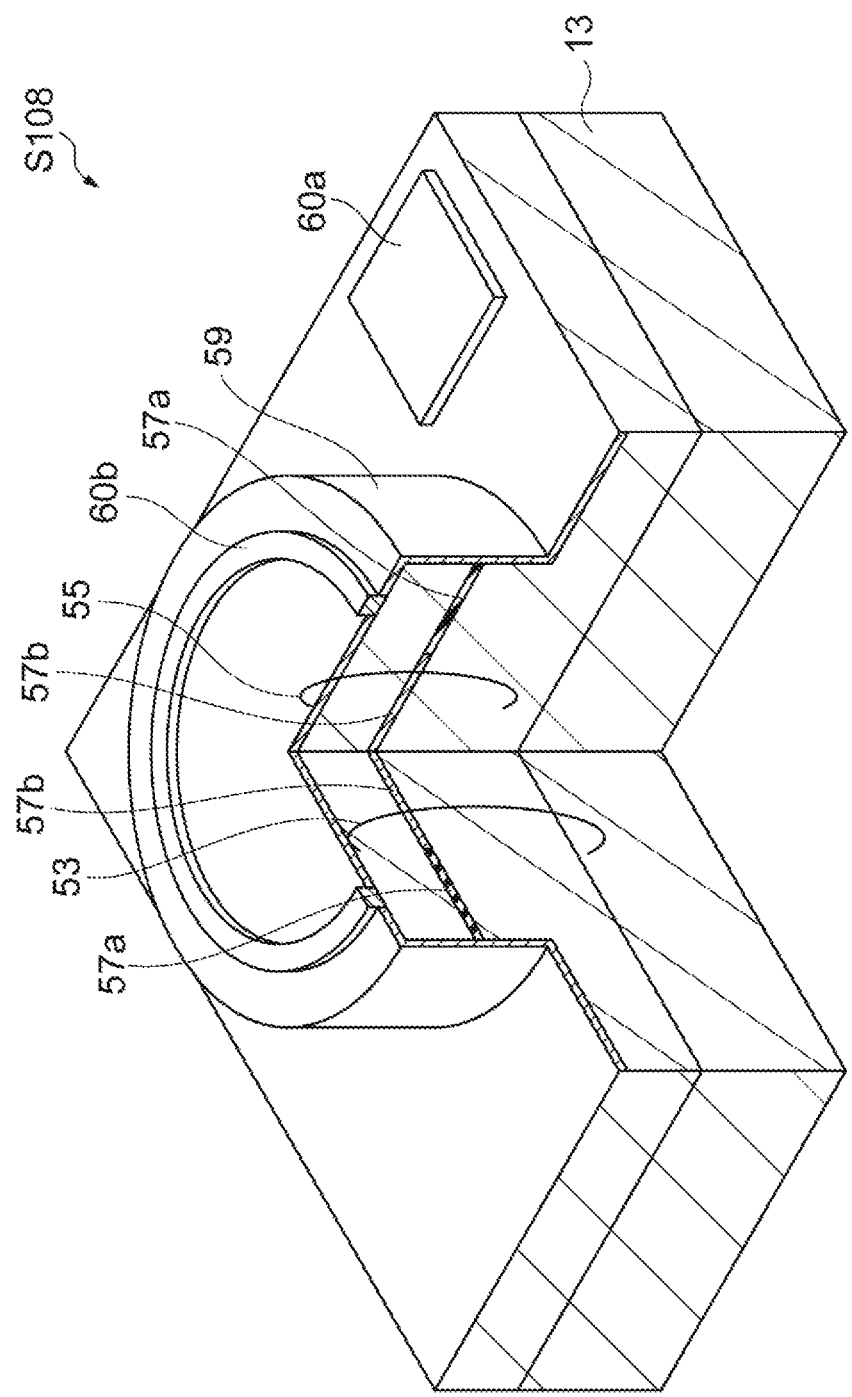
FIG. 12 is a schematic view showing a major step in the method for fabricating the surface emitting laser according to the present embodiment.

In step S108, as shown in FIG. 12, the first electrode 60a and the second electrode 60b are formed in the first opening 59a and the second opening 59b, respectively. Each of the first electrode 60a and the second electrode 60b may include TI/Pt/Au laminate structure. The surface emitting laser, which is fabricated into a semiconductor chip, has an appearance as shown in FIG. 12.

The above steps in the fabrication complete a surface emitting laser.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A method for fabricating a surface emitting laser comprising the steps of:
    preparing a processing apparatus with a first part and a second part, the processing apparatus including a stage disposed in the second part, a first heater, and a second heater that are disposed in the first part and the second part, respectively, the first heater and the second heater being connected to a first heater power source and a second heater power source respectively, the first heater power source being different from the second heater power source, the stage having a supporting face;
    preparing a wafer product for forming a surface emitting laser, the wafer product having a front surface, a back surface opposite to the front surface, and a semiconductor post including a III-V compound semiconductor layer containing aluminum as a constituent element, the III-V compound semiconductor layer being exposed at a side face of the semiconductor post;
    disposing the wafer product in the second part of the processing apparatus, the stage supporting the wafer product on the back surface of the wafer product;
    after disposing the wafer product in the second part of the processing apparatus, energizing the first heater and the second heater, the first heater and the second heater being energized at different times;
    after energizing the second heater, supplying a first gas containing no oxidizing agent to the processing apparatus and heating the first gas by the first heater, the first gas flowing from the first part of the processing apparatus to the second part thereof and thereby heating the wafer product in the second part thereof; and
    after heating the wafer product by the first gas, oxidizing the III-V compound semiconductor layer by stopping supplying of the first gas and supplying a second gas containing an oxidizing agent to the processing apparatus.

2. The method according to claim 1,
    wherein the first gas contains at least one of helium or hydrogen.

3. The method according to claim 1,
    wherein the second gas contains water vapor as the oxidizing agent.

4. The method according to claim 1,
    wherein the processing apparatus has a horizontal type reactor.

5. The method according to claim 1,
    wherein the processing apparatus has a vertical type reactor.

6. The method according to claim 1,
    wherein the stage includes the second heater.

7. The method according to claim 1,
    wherein the first gas thus heated and the second heater heat the front and back surfaces of the wafer product.

8. The method according to claim 1, wherein the processing apparatus
    includes a chamber having a first portion in the first part of the processing apparatus and a second portion in the second part of the processing apparatus, the first and second portions being arranged to provide the first gas and the second gas with a gas flow path,
    the first heater and the second heater heat the first portion and the second portion, respectively,
    the gas flow path has a first cross-sectional area in the first portion and a second cross-sectional area in the second portion, and
    the second cross-sectional area is smaller than the first cross-sectional area.

9. The method according to claim 1,
    wherein the wafer product has a warpage.

10. The method according to claim 9,
    wherein the stage is in direct contact with a part of the back surface of the wafer product.

11. The method according to claim 1,
    wherein the first heater starts to increase temperature thereof at a first time, and the second heater starts to increase temperature at a second time different from the first time.

12. The method according to claim 1,
    wherein the second heater starts to be energized earlier than the first heater.

13. The method according to claim 1, wherein
    the first heater increases temperature thereof at a first rate of increase in temperature,
    the second heater increases temperature thereof at a second rate of increase in temperature, and
    the first rate is greater than the second rate.

14. The method according to claim 1, further comprising the steps of:
    after oxidizing the III-V compound semiconductor layer, lowering the temperature of the first heater; and
    after oxidizing the Ill-V compound semiconductor layer, lowering the temperature of the second heater.

15. The method according to claim 14,
    wherein the first heater starts to decrease temperature thereof at a first time, and the second heater starts to decrease temperature thereof at a second time different from the first time.

16. The method according to claim 14,
    wherein the first heater starts to decrease the temperature thereof earlier than the second heater.

17. The method according to claim 14, wherein
    the first heater lowers the temperature thereof at a first rate of decrease in temperature,
    the second heater lowers temperature thereof at a second rate of decrease in temperature, and
    the first rate of decrease is greater than the second rate of decrease.

18. The method according to claim 1, wherein the first heater heats the first gas to a first temperature, and the second heater heats the second gas to a second temperature different from the first temperature.

19. The method according to claim 1, wherein
the first heater heats the first gas to a first temperature,
the second heater heats the second gas to a second temperature, and
the first temperature is substantially the same as the second temperature.

* * * * *